(12) United States Patent
Pruitt

(10) Patent No.: US 7,154,165 B2
(45) Date of Patent: Dec. 26, 2006

(54) FLASHLESS LEAD FRAME WITH HORIZONTAL SINGULATION

(75) Inventor: David Pruitt, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/895,095

(22) Filed: Jul. 21, 2004

(65) Prior Publication Data

US 2006/0017140 A1    Jan. 26, 2006

(51) Int. Cl.
*H01L 23/495* (2006.01)
*H01L 23/48* (2006.01)
*H01L 23/52* (2006.01)

(52) U.S. Cl. .................. 257/670; 257/666; 257/669
(58) Field of Classification Search ............. 257/666, 257/670, 690
See application file for complete search history.

(56) References Cited

U.S. PATENT DOCUMENTS

| 6,251,568 B1 * | 6/2001 | Hsia et al. ............. 430/325 |
| 6,281,568 B1 * | 8/2001 | Glenn et al. ........... 257/684 |
| 6,894,370 B1 * | 5/2005 | Kiyohara ............... 257/666 |

* cited by examiner

*Primary Examiner*—Nitin Parekh
(74) *Attorney, Agent, or Firm*—McDermott Will & Emery LLP

(57) ABSTRACT

A lead frame is configured for use with a singulation apparatus that eliminates flash. A die pad is attached to sides of the frame by tie bars and peripheral portions. The peripheral portions have cutout sections defining openings that are bridged by lead frame segments. The apparatus applies a downward force to the lead frame segments and translates the downward force to a horizontal force applied to the tie bars. The singulation process confines movement of the lead frame metal to within the plane of the lead frame.

4 Claims, 9 Drawing Sheets

FLASHLESS LEAD FRAME WITH HORIZONTAL SINGULATION

FIELD OF THE INVENTION

The present invention relates to lead frames for semiconductor packages, more particularly to the separation of one or more such packages from a common lead frame.

BACKGROUND

Typical processing of an integrated circuit produces an encapsulated package within which an IC die is supported by a die pad, with bond wires connected from bond pads disposed on the die to respective leads that extend externally from the encapsulated package. A generally planar, metal strip with patterned openings is used as a lead frame upon which several IC packages will be fabricated and thereafter separated from the lead frame. FIG. 1 is a perspective view of a portion of a typical lead frame 10 for one IC package prior to formation of the package. The dashed line block 12 circumscribes a portion of the metal strip that will be part of the package after completion of the process, including a die pad 14 and individual leads 16. The die pad is shown attached to the periphery of the lead frame by tie bars 20, which contain notches 22. The IC package is fabricated by adhesively mounting a die to the die pad, forming bonding connections between individual bond pads on the die and respective leads 16, and applying a molding compound to encapsulate the die pad, bond wires and leads substantially within the area defined by block 12. Thereafter, leads are detached from the common connection with the lead frame and further processed to obtain desired lead configurations. At this stage, the encapsulated package remains attached to the lead frame periphery by tie bars 20.

With standard methodology, separation of the encapsulated semiconductor package from the lead frame, commonly termed "singulation," is achieved using tools that apply load directly to the package. The lead frame periphery is clamped and forced to separate from the package by thrust of a punch. The punch tends to force the package out of the plane of the supporting members, thus placing the connecting tie bar metal in tension. The deformed metal reaches its ultimate strength until a break occurs at notches 22. The forces applied to the package create a moment directly related to the application of the force. This moment can be devastating to the molded unit, resulting in silicon die cracking and/or plastic package cracking.

An additional problem encountered with conventional singulation techniques is the formation of "flash." Flash is the result of the plastic molding operation. Due to tooling tolerances, the lead frame must maintain a distance from the edge of the molded unit to the singulation paring line. Flash is the plastic material that is trapped around the separation area of the lead frame. Plastic molding material protrudes from the package ends with varying degrees of distance. The presence of flash raises concerns that must be addressed in the methods of delivery of IC packages. Typical delivery methods include "tape and reel" delivery and "tube" delivery. With tape and reel delivery, units are placed into a pocket which is then sealed by tape. The size of the pocket must be chosen to accommodate all molded unit packages. Since flash tends to vary in a random fashion, large pockets must be provided. A tube delivery system transports a plurality of IC packages in each tube. A "shingling" problem often occurs as a result of flash interaction between adjoining packages, wherein the units are wedged in place within the tube. Safe and expedient removal of the packages from the tube becomes a difficulty.

The need thus exists for a singulation method and apparatus that avoid damaging the semiconductor packages, eliminate flash, and for an improved lead frame configuration that is compatible with such method and apparatus.

DISCLOSURE OF THE INVENTION

The present invention fulfills the above-described needs of the prior art at least in part by avoiding the bending moment force incident to conventional singulation techniques. A lead frame is appropriately configured for use with the apparatus of the invention and for elimination of flash. A die pad is attached to sides of the frame by tie bars and peripheral portions. The peripheral portions have cutout sections defining openings that are bridged by lead frame segments. The apparatus appropriately applies a force to the lead frame segments for separation of the tie bars from the package during singulation, while confining movement of the lead frame metal to within the plane of the lead frame.

The apparatus advantageously includes a generally planar supporting platform having a cavity recessed for accommodating a portion of an encapsulated semiconductor package when the lead frame and semiconductor package are placed on a surface of the platform. A slot in the supporting platform is separated from the cavity by an intermediate portion of the platform. Lead frame segments connected between the lead frame periphery and the semiconductor package overlay the intermediate portion and the slot. A clamping platform having a vertical slot extending therethrough is aligned with the slot in the supporting platform when the clamping platform is appropriately positioned on the supporting platform, with the lead frame and attached semiconductor package positioned therebetween. A surface of the clamping platform that mates with the supporting platform comprises a recess generally conforming to and aligned with the cavity in the supporting platform, so that the encapsulated package is encompassed within the space created by the clamping platform recess and the supporting platform cavity. The portion of the clamping platform between the recess and the slot is recessed from the surface to a lesser degree.

A punch instrument, configured to conform with the slot in the mounting platform, can be thrust downwardly to separate the lead frame segments from the semiconductor package. The punch instrument preferably is joined to a thrusting platform that is slidably engageable with the clamping platform in a direction perpendicular to the plane of the lead frame. The slot in the supporting platform is generally parallel to a sidewall of the cavity, the intermediate portion surface therebetween forming a rib for supporting the lead frame segments that are to be separated from the semiconductor package. A similar slot may be provided parallel and adjacent to an opposite sidewall of the cavity for separating lead frame segments on the other side of the semiconductor package. The clamping and thrusting platforms are provisioned with respect to the second slot in similar fashion; the arrangement can be replicated to accommodate a plurality of semiconductor devices that are connected to the lead frame. Thus, the supporting platform may comprise a plurality of cavities, a pair of slots adjacent each cavity, the mounting platform having a plurality of slots for alignment with the slots in the supporting platform, and the thrusting platform is provide with a plurality of punches, whereby a plurality of semiconductor packages can be severed simultaneously from a single lead frame. Preferably, the cavities are configured in the supporting platform in an array of rows, each row comprising a plurality of cavities. A substructure upon which the supporting platform can be removably placed is configured with rows of recesses that are aligned respectively with the rows of the cavities in the supporting platform. Semiconductor packages that are separated from the lead frame are deposited in corresponding recesses of the substructure.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawing and in which like reference numerals refer to similar elements and in which.

DETAILED DESCRIPTION OF THE INVENTION

Figure 1:
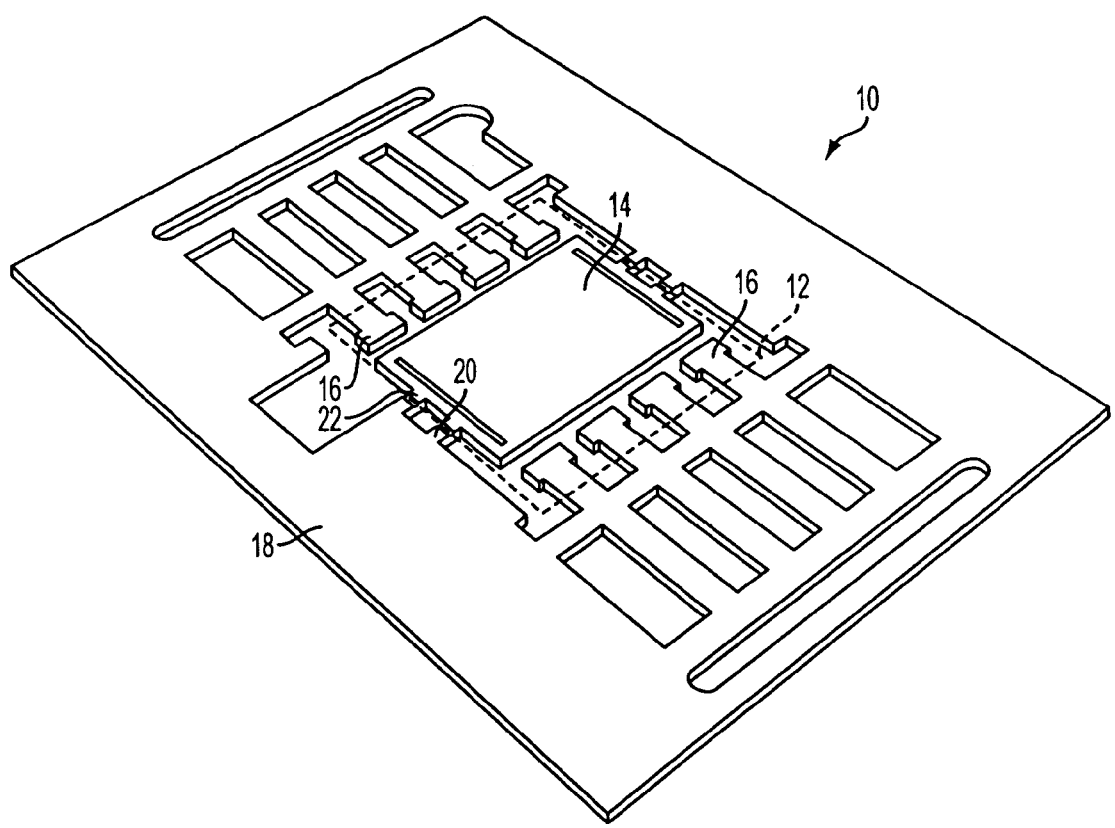
FIG. 1 is a perspective view of a portion of a typical lead frame for an IC package.
Figure 2:
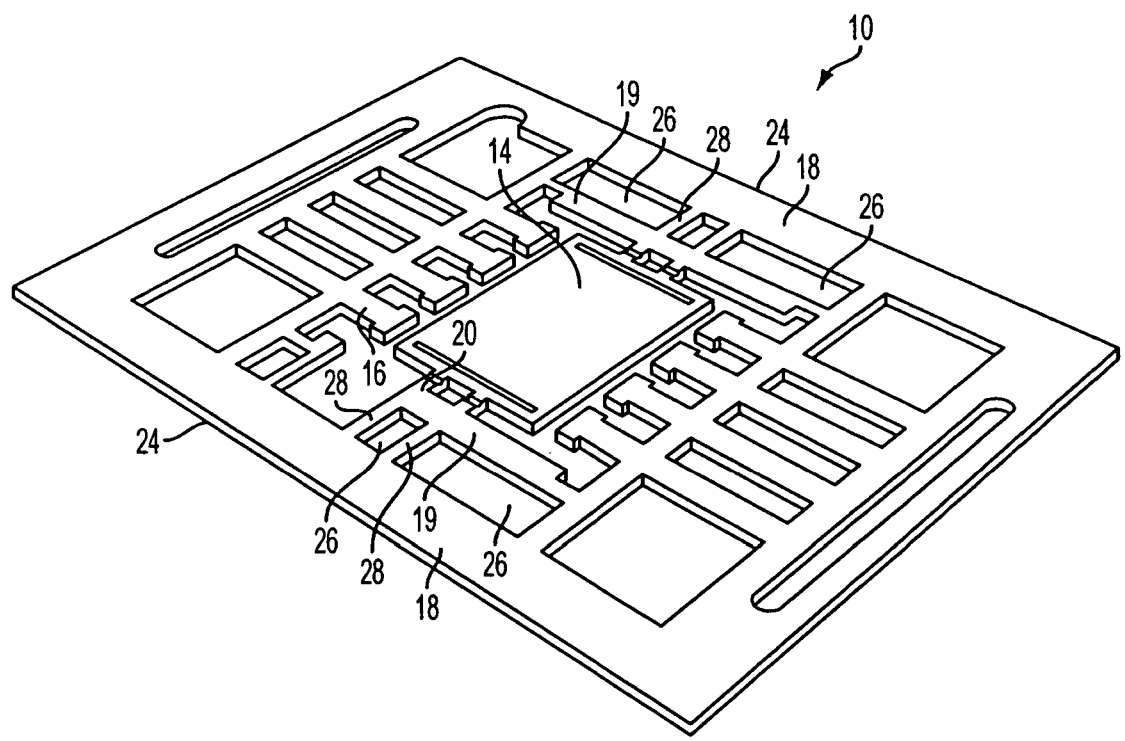
FIG. 2 is a perspective view of a portion of a lead frame in accordance with the present invention.
Figure 3:
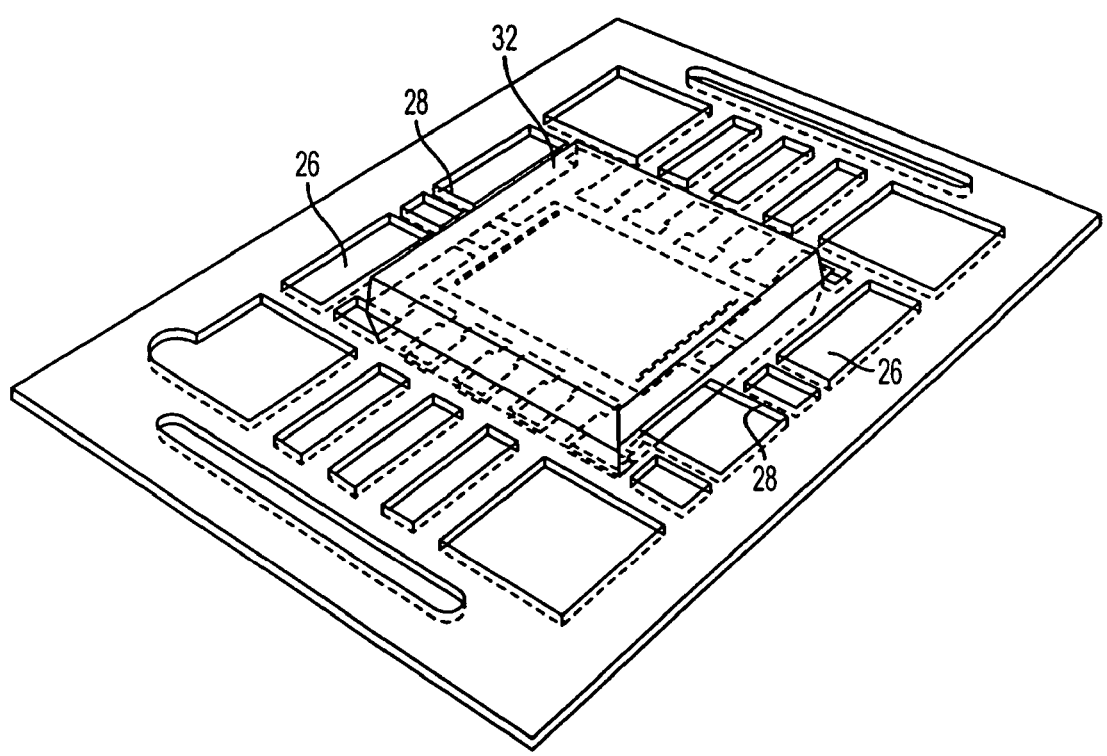
FIG. 3 is a perspective view of the lead frame portion of FIG. 2 with the encapsulation package shown transparently.
Figure 4:
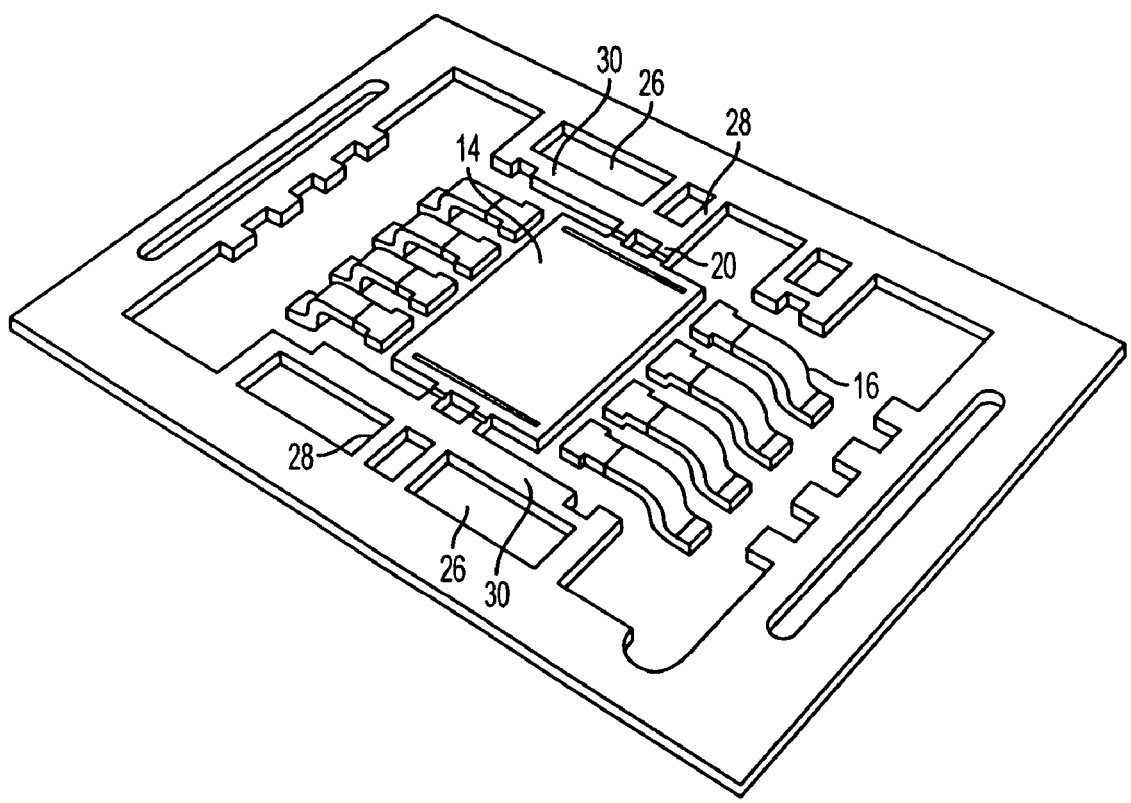
FIG. 4 is a perspective view of the lead frame portion of FIG. 2 after the leads have been separated from the lead frame.

A lead frame 10 in accordance with the present invention is shown in FIG. 2. While only a single semiconductor package frame portion is shown, the configuration is replicated on a single metal strip to accommodate a plurality of semiconductor packages as described below. Die pad 14 is attached to opposite sides 24 of the lead frame by tie bars 20 via peripheral portions. Each peripheral portion comprises cutout sections, or openings 26, and lead frame segments 28 that bridge the openings between outer peripheral portion 18 and inner peripheral portion 19. The lead frame segments are substantially in alignment with the tie bars and separated therefrom by the peripheral portions 19. The semiconductor encapsulation, which is formed before the leads are separated processed, is bounded as shown in transparency in FIG. 3. The encapsulated package 32 extends above and below the lead frame by substantially the same distance. FIG. 4 depicts the lead frame after the leads 16 have been detached and processed. The encapsulated package, other than the lead frame, has been deleted for clarity of illustration.

Figure 5:
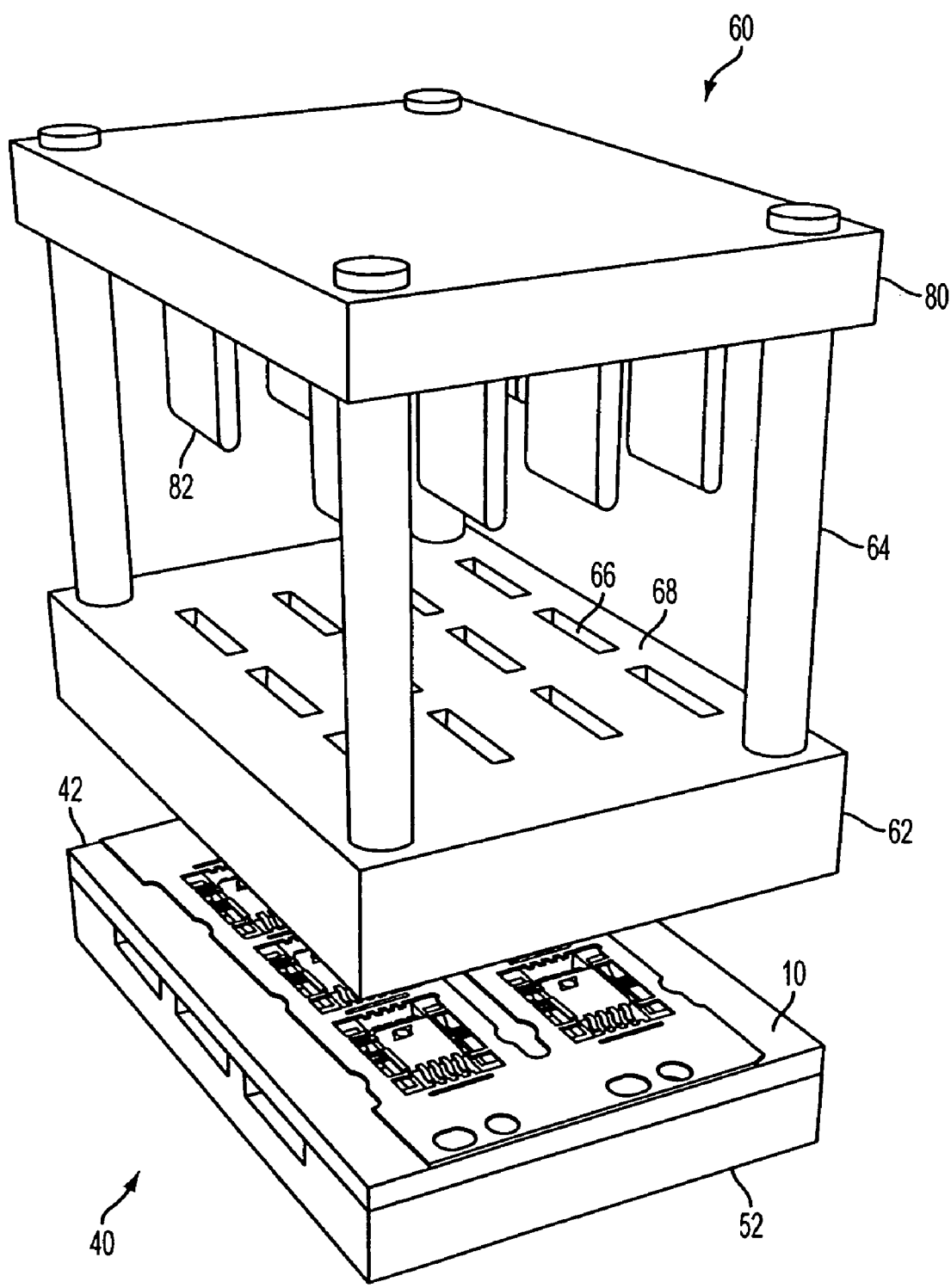
FIG. 5 is a perspective view of a singulation apparatus in accordance with the present invention.
Figure 9:
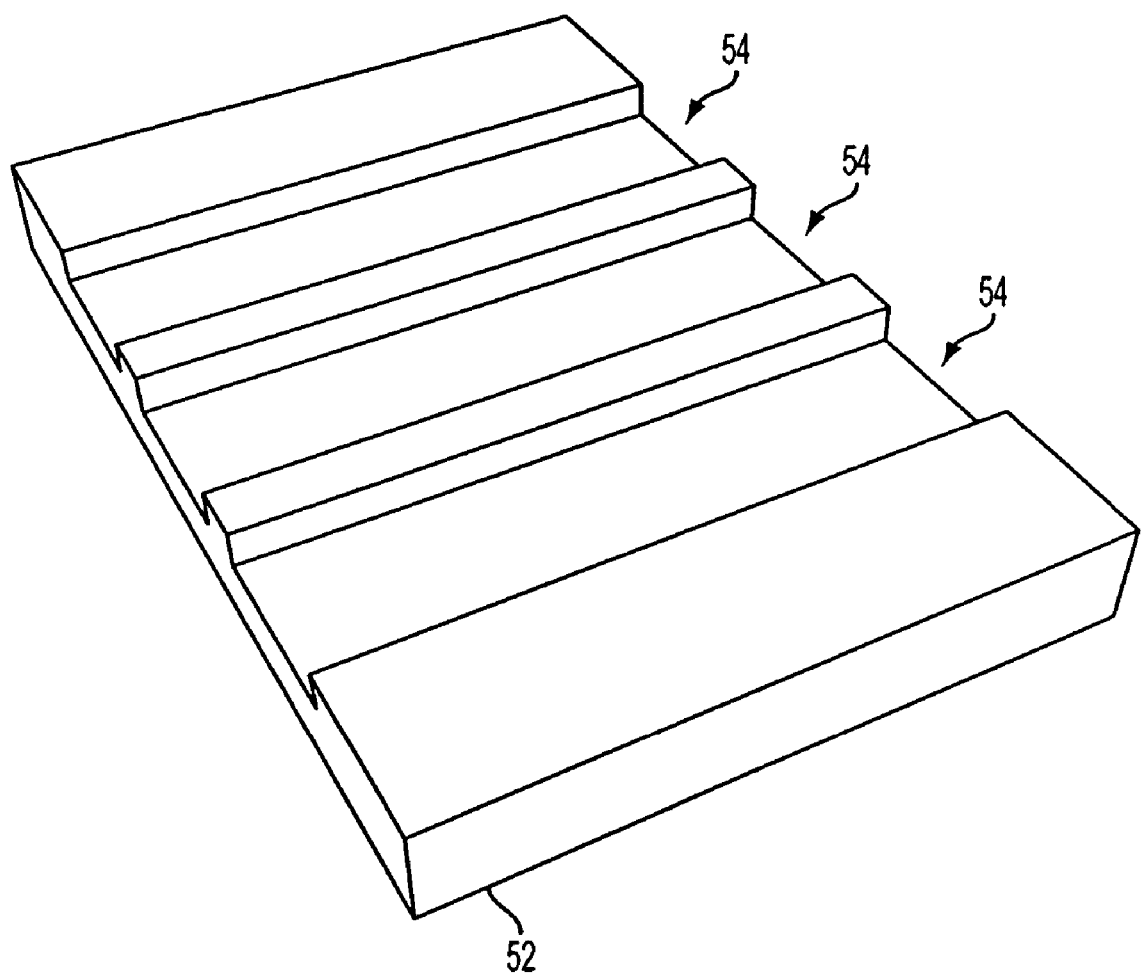
FIG. 9 is a perspective view of a substructure of the apparatus of FIG. 5.

At this stage, the package is attached to the lead frame only by the notched tie bars 20 and only singulation is required to complete the package process. Apparatus for performing singulation according to the present invention is shown in the three-dimensional perspective view of FIG. 5. The apparatus comprises a lower section 40 and an upper section 60. Support platform 42 of the lower section is removably coupled with the substructure 52 in the position shown. Lead frame 10, to which are attached a plurality of encapsulated packages, is supported by the support platform, which is shown in more detail in FIG. 6. Substructure 52 is shown in more detail in FIG. 9.

In upper section 60, clamping platform 62 is slidably engageable with thrusting platform 80 by means of spring loaded guides 64. A plurality of vertically oriented slots 66 extend from upper surface 68 of clamping platform 62 to the lower surface 70, shown in FIG. 8. Extending downwardly from the thrusting platform are a plurality of punch instruments equal in number to the number of slots 66. The punch instruments are vertically aligned with the slots 66 and configured to fit within, and extend beyond, the slots when the lower thrusting platform is moved downwardly to fully engage clamping platform 62.

Figure 6:
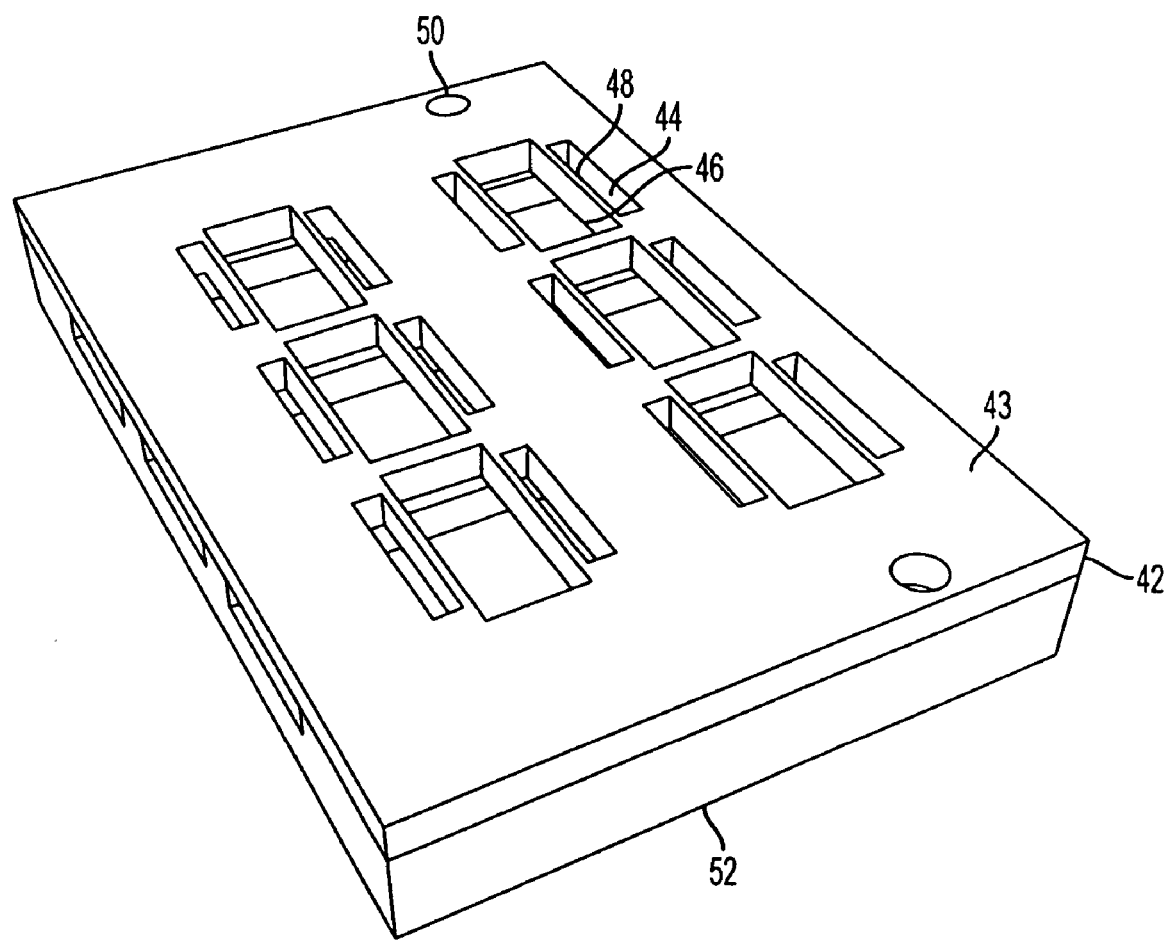
FIG. 6 is a perspective view of a supporting platform component of the apparatus of FIG. 5.

The support platform 42, shown in FIG. 6, has a generally planar upper surface 43. An array of slots 44 and cavities 46 are provided for supporting a lead frame having six encapsulated IC packages attached thereto. Each cavity 46 is separated from a slot 44 on opposites sides by an intermediate support portion 48 for accommodating one of the encapsulated packages of the lead frame. The upper surface of the intermediate portion is in the plane of surface 43. Holes 50 are provided for aligning support platform 42 of lower section 40, with a lead frame 10 and clamping platform 62 of upper section 60.

Figure 8:
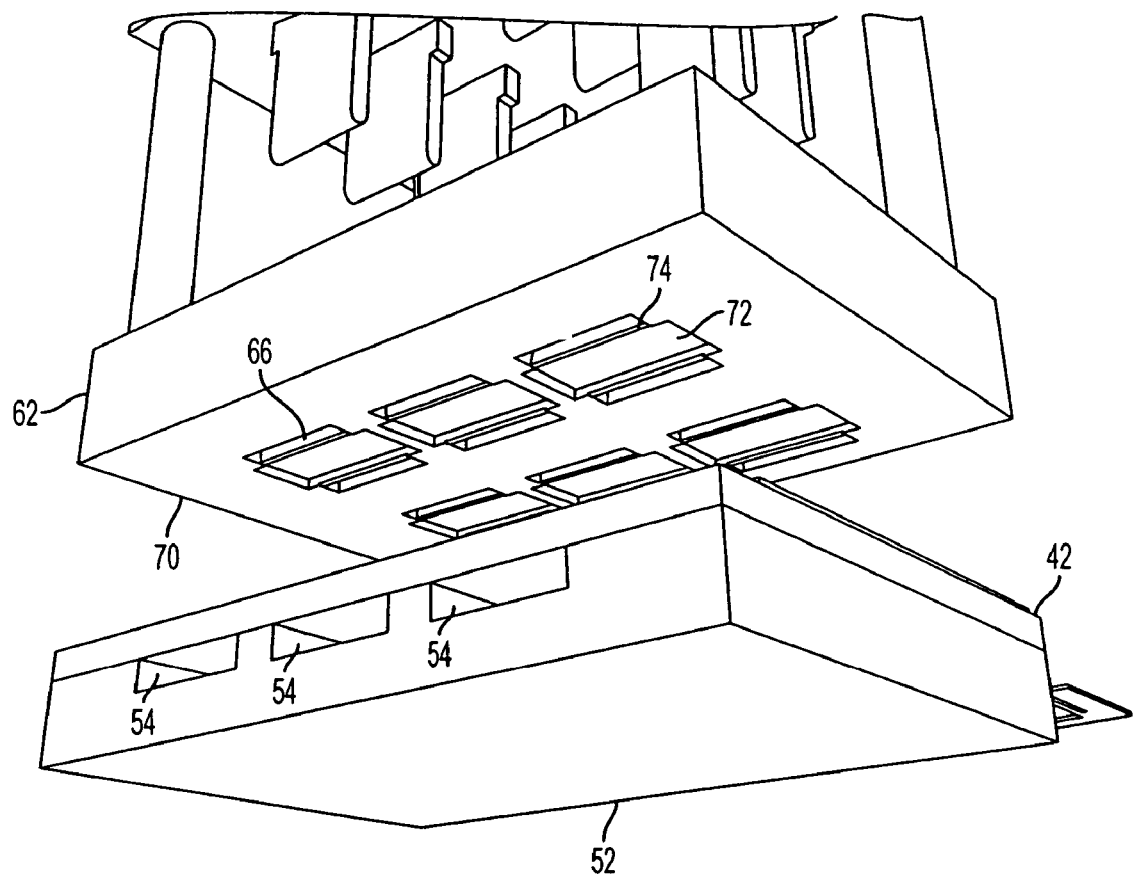
FIG. 8 is a partial perspective view of the apparatus of FIG. 5.

The lower surface 70 of clamping platform 62 can be seen in FIG. 8. Six recesses 72 conform in perimeter, and are aligned, with the corresponding cavities 46 in the supporting platform. The recesses are sufficiently deep to provide enough space encompass the portions of the encapsulated packages that are above the plane of the lead frame. The portions 74 of the clamping platform that are between the recesses and slots also are recessed from the surface 70. Substructure 52 contain three channels 54, as seen more clearly in FIG. 9. Each channel is aligned with a pair of cavities 46 in the support platform and serves as a repository for the IC packages after singulation has been completed.

Figure 7:
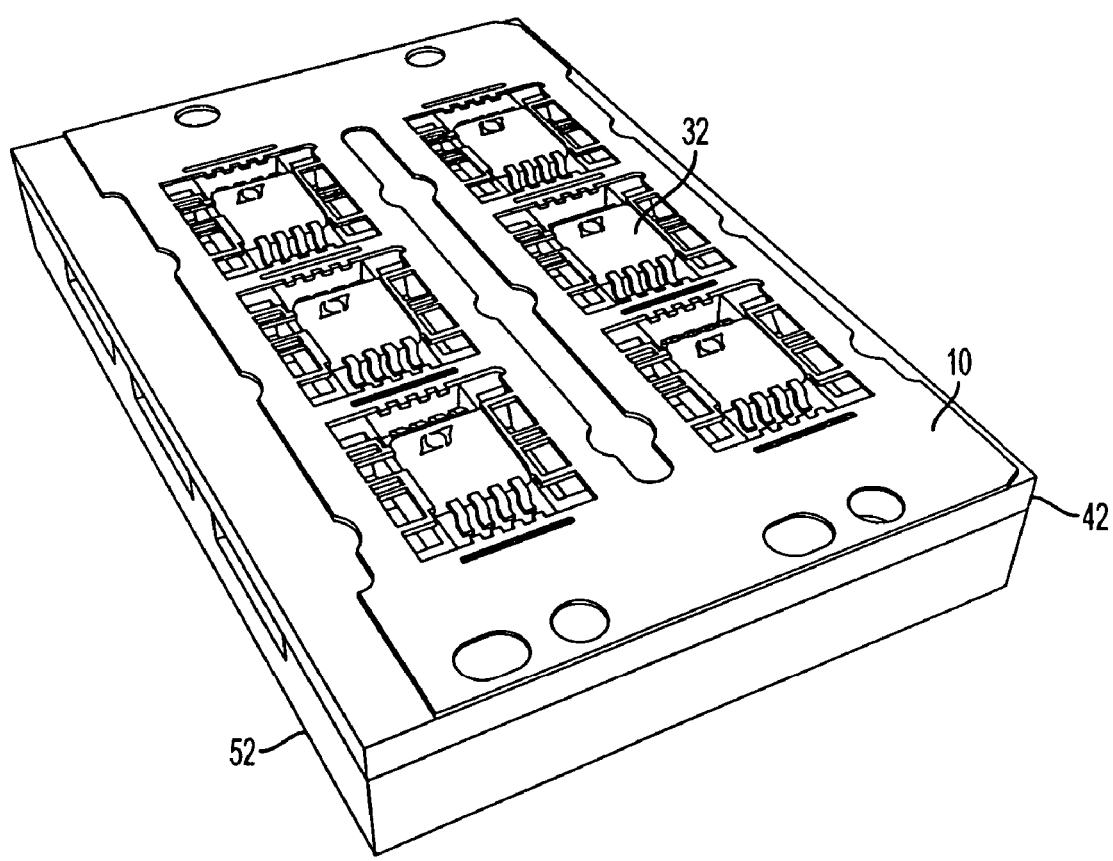
FIG. 7 is a perspective view of the supporting platform of FIG. 6 having placed thereon a lead frame in accordance with the present invention.

In the singulation operation, the lead frame 10 is placed, with the encapsulated IC packages attached, on the supporting platform 42 as shown in FIG. 7. Each encapsulated package 32, and its associated leads 16, overlays a cavity 46 without contact with surface 43 of the support platform. The bulk of each encapsulation package that is below the plane of lower surface of the lead frame extends into a respective cavity. The lead frame is in contact with the support platform except for the lead frame segments 28 that overlay the slots 44. The tie bars 20 on opposite sides of each package are in contact with, and supported by, the intermediate portions 48 of the support platform.

The upper section 60 is then mounted on the support platform and aligned therewith so that slots 66 overlay slots 44 and recesses 72 overlay cavities 46. The lead frame is clamped between the platform 62 of the upper section and the support platform 42. Platform 80 is then thrust downwardly to drive the punch instruments 82 through the aligned slots 66 in clamping platform 62 to impose a downward force on the lead frame segments 20 simultaneously on both opposite sides of the packages. As the tie bars are supported by intermediate portions 48 of the support platform, the downward force creates a horizontal force on the tie bars, which is sufficient to cause separation of the tie bars from the encapsulated packages at the notches 22. Horizontal movement of the tie bars is not impeded by the clamping platform due to the recesses 74 in the surface 70. The packages are then completely detached from the lead frame and are individually deposited in the channels 54 of substructure 52.

Singulation has been achieved without imposition of bending forces on the packages that can cause damage. As there is no protrusion of molding material from the package ends, flash has been eliminated.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein.

What is claimed is:

1. A lead frame for use in an integrated circuit package, the lead frame comprising:
    a generally planar, metal strip with patterned openings interior of a rectangular periphery;
    a plurality of leads attached to the periphery only at two opposite sides of the frame; and
    a die pad attached to the periphery at sides of the frame, which are orthogonal to said opposite sides, by tie bars and cutout sections, the cutout sections comprising openings exterior to the tie bars and lead frame segments that bridge the openings;
    wherein the tie bars are configured with portions which, in combination with the cutout sections, preclude application of bending forces to the die pad during singulation.

2. A lead frame as recited in claim 1, wherein said lead frame segments are substantially in alignment with said tie bars in a direction generally parallel to said opposite sides.

3. A lead frame as recited in claim 1, wherein the tie bar portions contain notches located between the die pad and the cutout sections.

4. A lead frame as recited in claim 1, wherein said openings are remote from said leads.

* * * * *